(12) United States Patent
Guillemenet et al.

(10) Patent No.: US 9,042,157 B2
(45) Date of Patent: May 26, 2015

(54) PROGRAMMABLE VOLATILE/NON-VOLATILE MEMORY CELL

(75) Inventors: Yoann Guillemenet, Crest (FR); Lionel Torres, Combaillaux (FR)

(73) Assignees: CENTRE NATIONAL DE LA RECHERCHE SCIENTIFIQUE (FR); UNIVERSITE MONTPELLIER 2 (FR)

(*) Notice: Subject to any disclaimer, the term of this patent is extended or adjusted under 35 U.S.C. 154(b) by 7 days.

(21) Appl. No.: 13/980,558

(22) PCT Filed: Jan. 19, 2012

(86) PCT No.: PCT/EP2012/050772
§ 371 (c)(1),
(2), (4) Date: Oct. 30, 2013

(87) PCT Pub. No.: WO2012/098184
PCT Pub. Date: Jul. 26, 2012

(65) Prior Publication Data
US 2014/0050012 A1    Feb. 20, 2014

(30) Foreign Application Priority Data
Jan. 19, 2011    (FR) ..................... 11 50406

(51) Int. Cl.
*G11C 13/00* (2006.01)
*G11C 11/16* (2006.01)
*G11C 11/412* (2006.01)

(52) U.S. Cl.
CPC ............ *G11C 13/0069* (2013.01); *G11C 11/16* (2013.01); *G11C 11/412* (2013.01); *G11C 13/0002* (2013.01)

(58) Field of Classification Search
CPC .... G11C 11/16; G11C 11/412; G11C 13/002; G11C 13/0069

USPC .......... 365/148, 154, 158, 163, 185.08, 189.2
See application file for complete search history.

(56) References Cited

U.S. PATENT DOCUMENTS

| 4,006,469 A | 2/1977 | Leehan et al. |
| 5,973,965 A | 10/1999 | Berthold et al. |

(Continued)

FOREIGN PATENT DOCUMENTS

| EP | 1134746 A2 | 9/2001 |
| FR | 2966636 A1 | 4/2012 |

(Continued)

OTHER PUBLICATIONS

Zhao et al., "TAS-MRAM based Non-volatile FPGA logic circuit", Dec. 1, 2007, pp. 153-160, Publisher: International Conference on Field-Programmable Technology. ICFPT 2007. IEEE, XP031208385.

(Continued)

*Primary Examiner* — Tan T. Nguyen
(74) *Attorney, Agent, or Firm* — Kaplan Breyer Schwarz & Ottesen, LLP

(57) ABSTRACT

The invention concerns a memory device comprising at least one memory cell comprising: a first transistor (102) coupled between a first storage node (106) and a first supply line (GND, $V_{DD}$); a second transistor (104) coupled between a second storage node and said first supply line (GND, $V_{DD}$), control terminals of said first and second transistors being coupled to said second and first storage nodes respectively; a third transistor (110) coupled between said first storage node and a first access line (BL) and controllable via a first control line (WL1); a fourth transistor (112, 712) coupled between said second storage node (108) and a second access line (BLB) and controllable via a second control line; and a first resistance switching element (202) coupled in series with said first transistor and programmable to have one of first and second resistive states.

15 Claims, 5 Drawing Sheets

(56) References Cited

U.S. PATENT DOCUMENTS

| | | | |
|---|---|---|---|
| 7,495,945 B2* | 2/2009 | Roehr | 365/148 |
| 7,760,538 B1 | 7/2010 | Paak | |
| 7,764,081 B1 | 7/2010 | Tuan et al. | |
| 7,796,417 B1 | 9/2010 | Lewis | |
| 8,508,983 B2 | 8/2013 | Wang et al. | |
| 8,605,490 B2 | 12/2013 | Fackenthal | |
| 8,773,896 B2* | 7/2014 | Shukh | 365/154 |
| 2003/0161184 A1 | 8/2003 | Lee et al. | |
| 2003/0204689 A1 | 10/2003 | Shimoda | |
| 2004/0125643 A1 | 7/2004 | Kang et al. | |
| 2004/0141363 A1 | 7/2004 | Ohtsuka et al. | |
| 2006/0181916 A1 | 8/2006 | Roehr | |
| 2007/0041242 A1 | 2/2007 | Okazaki et al. | |
| 2000/0889146 | 4/2008 | Fujito, et al. | |
| 2009/0109734 A1 | 4/2009 | Hanafi | |
| 2010/0080042 A1 | 4/2010 | Lamorey | |
| 2010/0188891 A1 | 7/2010 | Taniguchi et al. | |
| 2010/0202191 A1 | 8/2010 | Ahn et al. | |
| 2010/0259975 A1 | 10/2010 | Toda | |
| 2010/0271866 A1 | 10/2010 | Sakimura et al. | |
| 2011/0085372 A1 | 4/2011 | Fackenthal | |
| 2011/0208904 A1 | 8/2011 | Fujito et al. | |

FOREIGN PATENT DOCUMENTS

| | | |
|---|---|---|
| FR | 2970589 A1 | 7/2012 |
| JP | 2003157671 A | 5/2003 |
| WO | 2007045202 A1 | 4/2007 |
| WO | 2008112746 A2 | 9/2008 |
| WO | 2010065691 | 6/2010 |

OTHER PUBLICATIONS

Damien Czarik, "Related International Patent Applicaiton No. PCT/EP2012/050772", "International Search Report ", Jul. 12, 2012, Publisher: EPO, Published in: EP.

IBM, "Combined Single/Dual-Port Array Approach with 6-Device Cell," IBM Technical Disclosure Bulletin, Jun. 1, 1988, pp. 291-292, vol. 31, No. 1, Publisher: IBM Corp., Published in: US.

Yoann Guillemenet et al, "A Non-Volatile Run-Time FPGA Using Thermally Assisted Switching MRAMS," pp. 421-426.

G. Grynkewich et al, "Nonvolatile Magnetoresistive Random-Access Memory Based on Magnetic Tunnel Junctions," Nov. 2004, pp. 818-821.

William C. Black, Jr. et al., "Programmable logic using giant-magnetoresistance and spin-dependent tunneling devices invited," May 1, 2000, pp. 6674-6679, vol. 87, No. 9, Publisher: AIP Publishing.

Yamamoto et al., "Nonvolatile Static Random Access Memory Using Resistive Switching Devices: Variable-Transconductance Metal Oxide Semiconductor Field-Effect-Transistor Approach," Japanese Journal of Applied Physics, Apr. 1, 2010, pp. 40209-1, vol. 49, No. 4, Publisher: Japan Society of Applied Physics, Published in: JP.

Yoan Guillemenet et al., (related) U.S. Appl. No. 13/980,529, Feb. 13, 2014, Publisher: USPTO.

Damien Czarik, "International Search Report," Jul. 26, 2012, for International Patent Application No. PCT/ EP2012/050800, which corresponds to related U.S. Appl. No. 13/980,529, Publisher: WIPO.

Prenat Guillaume et al., (related) U.S. Appl. No. 13/980,555, Mar. 20, 2014, Publisher: USPTO.

Yoan Guillemenet et al., (related) U.S. Appl. No. 13/980,559, Mar. 13, 2014, Publisher: USPTO.

Yoan Guillemenet et al., (related) U.S. Appl. No. 14/126,051, Jun. 19, 2014, Publisher: USPTO.

Balaguer Lopez, J , "International Search Report," Dec. 20, 2012, for International Application No. PCT/ EP2012/061267, which corresponds to related U.S. Appl. No. 14/126,051, Publisher: WIPO.

Don Le, "Notice of Allowance," Sep. 26, 2014, for related U.S. Appl. No. 14/126,051, Publisher: USPTO.

Jim Lindquist, "International Search Report," Dec. 20, 2012, for International Patent Application No. PCT/EP2012/061268, which corresponds to related U.S. Appl. No. 14/126,067, Publisher: WIPO.

Michael Thanh Tran, "Non-Final Office Action" Oct. 8, 2014, for related U.S. Appl. No. 14/126,067, Publisher: USPTO.

Yoan Guillemenet et al., (related) U.S. Appl. No. 14/126,067, Sep. 18, 2014, Publisher: USPTO.

Gregory Di Pendina et al., (related) U.S. Appl. No. 14/324,110, filed Jul. 4, 2014, Publisher: Not Published.

Balaguer Lopez, J., "French Search Report," dated Mar. 7, 2014, for French Patent Application No. 13/56637, which corresponds to related U.S. Appl. No. 14/324,110.

Yue Zhang et al, "Compact Modeling of Perpendicular-Anisotrophy CoFeB/MgO Magnetic Tunnel Junctions, (related to U.S. Appl. No. 14/446,044)", Mar. 2012, pp. 819-826, vol. 59, No. 3.

Lionel Torres et al., "Evaluation of hybrid MRAM/CMOS cells for reconfigurable computing,".

Corinne Havard, "French Search Report," dated Jun. 12, 2014, for French Application No. 13/57536, which corresponds to related U.S. Appl. No. 14/446,044.

Delphine Mesplede, "International Search Report," Oct. 31, 2013, for International Application No: PCT/FR2013/050910, which corresponds to related U.S. Appl. No. 14/395,555, Publisher: WIPO.

Luqiao Liu, et al, "Magnetic switching by spin torque from the spin Hall effect," Published in: US.

Ioan Mina! Miron et al, "Perpendicular switching of a single ferromagnetic layer induced by in-plane current injection," Aug. 11, 2011, pp. 189-194, vol. 476.

L. Q. Liu et al., "Spin-Torque Switching with the Giant Spin Hall Effect of Tantalum", 2012, vol. 336, No. 555.

Sasikanth Manipatruni et al, "Voltage and Energy-Delay Performance of Giant Spin Hall Effect Switching for Magnetic Memory and Logic," pp. 1-16.

Simin Baharlou, "International Preliminary Report on Patentability," Oct. 28, 2014, for International Application No: PCT/FR2013/050910, which corresponds to related U.S. Appl. No. 14/395,555, Publisher: WIPO.

Yolaine Cussac, "International Preliminary Report on Patentability," Jul. 23, 2013, for International Patent Application No. PCT/EP2012/050800, which corresponds to related U.S. Appl. No. 13/980,529, Publisher: WIPO.

Damien Czarik, "International Preliminary on Patentability," Jul. 26, 2013, for International Patent Application No. PCT/EP2012/050798, which corresponds to related U.S. Appl. No. 13/980,555, Publisher: WIPO.

Agnes Wittmann-Regis, "International Preliminary Report on Patentability," Jul. 23, 2013, for International Patent Application No. PCT/EP2012/050798, which corresponds to related U.S. Appl. No. 13/980,555, Publisher: WIPO.

Damien Czarik, "International Search Report," Jul. 26, 2012, for International Patent Application No. PCT/EP2012/050767, which corresponds to related U.S. Appl. No. 13/980,559, Publisher: WIPO.

Agnes Wittmann-Regis, "International Preliminary Report on Patentability," Jul. 23, 2013, for International Patent Application No. PCT/EP2012/050767, which corresponds to related U.S. Appl. No. 13/980,559, Publisher: WIPO.

Agnes Wittmann-Regis, "International Preliminary Report on Patentability," Jul. 23, 2013, for corresponding International Patent Application No. PCT/EP2012/050772, Publisher: WIPO.

Agnes Wittmann-Regis, "International Preliminary Report on Patentability," Dec. 17, 2013, for International Patent Application No. PCT/EP2012/061267, which corresponds to related U.S. Appl. No. 14/126,051, Publisher: WIPO.

Agnes Wittmann-Regis, "International Preliminary Report on Patentability," Dec. 17, 2013, for International Patent Application No. PCT/EP2012/061268, which corresponds to related U.S. Appl. No. 14/126,067,Publisher: WIPO.

Prenat Guillaume et al., (related) U.S. Appl. No. 14/395,555, Oct. 20, 2014, Publisher: Not Published.

Related U.S. Appl. No. 14/446,044, Publisher: Not Published.

\* cited by examiner

US 9,042,157 B2

PROGRAMMABLE VOLATILE/NON-VOLATILE MEMORY CELL

FIELD OF THE INVENTION

The present invention relates to a programmable volatile/non-volatile memory cell, and to a method of reading a programmable non-volatile memory cell.

BACKGROUND OF THE INVENTION

FIG. 1 illustrates a typical static random access memory (SRAM) cell 100. A first inverter is formed of an N-channel MOS (NMOS) transistor 102 and P-channel MOS (PMOS) transistor 103 coupled in series between a supply voltage $V_{DD}$ and a ground voltage. A second inverter is formed of an NMOS transistor 104 and a PMOS transistor 105 also coupled in series between the supply voltage $V_{DD}$ and the ground voltage. The gates of transistors 104 and 105 are coupled to a node 106 coupled to the drains of transistors 102 and 103, while the gates of transistors 102 and 103 are coupled to a node 108 coupled to the drains of transistors 104 and 105, such that the inverters form a latch.

The nodes 106 and 108 store complementary voltage states Q and $\overline{Q}$, permitting one bit of data to be memorized by the cell. Node 106 is coupled to a bit line BL via a P-channel MOS (PMOS) transistor 110, while node 108 is coupled to a complementary bit line BLB via a PMOS transistor 112. The gates of transistors 110 and 112 are coupled to a word line WL, and are activated by a low signal allowing data to be written to or read from the cell 100.

The circuit 100 has advantage of being relatively quick to access during read and write operations. However, a disadvantage is that, as with all volatile memory cells, the stored data is lost if the supply voltage $V_{DD}$ is removed.

Flash memory is an example of a programmable non-volatile memory. A disadvantage with flash memory is that it is relatively slow to access when compared to the SRAM cell of FIG. 1, and requires a relatively high supply voltage. Furthermore, the Flash technology is difficult to integrate with CMOS, and has relatively low endurance.

In many applications there is a need for a programmable memory cell capable of storing non-volatile data, and having increased access speeds and low energy consumption.

SUMMARY OF THE INVENTION

It is an aim of embodiments of the present invention to at least partially address one or more needs in the prior art.

According to one aspect of the present invention, there is provided a memory device comprising at least one memory cell comprising: a first transistor coupled between a first storage node and a first supply line; a second transistor coupled between a second storage node and said first supply line, a control terminal of said first transistor being coupled to said second storage node, and a control terminal of said second transistor being coupled to said first storage node; a third transistor coupled between said first storage node and a first access line and controllable via a first control line; a fourth transistor coupled between said second storage node and a second access line and controllable via a second control line; and a first resistance switching element coupled in series with said first transistor and programmable to have one of first and second resistive states.

According to one embodiment, the memory device further comprises control circuitry adapted to store a data value at said first and second storage nodes by controlling said third transistor to consecutively: charge said first storage node to said first supply voltage; couple said first storage node to said second supply voltage; and after a first time period, disconnect said first storage node from said second supply voltage, the data value stored at said first and second storage nodes being determined by the resistive state of said first resistance switching element.

According to another embodiment, said first resistance switching element is the only resistance switching element of each of said at least one memory cells.

According to another embodiment, said control circuitry is further adapted to read said data stored at said second storage node via said fourth transistor.

According to another embodiment, each of said at least one memory cells further comprises: a second resistance switching element coupled in series with said second transistor and programmable to have one of first and second resistive states.

According to another embodiment, the memory device further comprises programming circuitry adapted to independently program the resistances of each of said first and second resistance switching elements based first and second input data values.

According to another embodiment, the third and fourth transistors are adapted to have a lower threshold voltage than said first and second transistors.

According to further embodiments, the first resistance switching element is either coupled between said first storage node and said first access line, or between said first transistor and said first supply voltage.

According to another embodiment, said first and second resistance switching elements are thermally assisted switching elements.

According to another embodiment, the first transistor is the only transistor of a first inverter of said at least one memory cell, and the second transistor is the only transistor of a second inverter of said at least one memory cell.

According to another aspect of the present invention, there is provided a random access memory comprising an array of the above memory devices.

According to another aspect of the present invention, there is provided a data latch comprising the above memory device.

According to another aspect of the present invention, there is provided a method of transferring a data value from non-volatile storage of a memory cell to first and second volatile storage nodes of said memory cell, wherein the memory cell comprises: a first transistor coupled between a first storage node and a first supply line; a second transistor coupled between a second storage node and said first supply line, a control terminal of said first transistor being coupled to said second storage node, and a control terminal of said second transistor being coupled to said first storage node; a third transistor coupled between said first storage node and a first access line and controllable via a first control line; a fourth transistor coupled between said second storage node and a second access line and controllable via a second control line; and a first resistance switching element coupled in series with said first transistor programmable to have one of first and second resistive states; the method comprising the consecutive steps of: charging said first storage node to said first supply voltage; controlling said third transistor to couple said first storage node to said second supply voltage; and after a first time period, controlling said third transistor to disconnect said first storage node from said second supply voltage, the data value being determined by the resistive state of said first resistance switching element.

According to one embodiment, the first resistance switching element is the only resistance switching element of said memory cell, the method further comprising reading the data stored at said second storage node by coupling said second storage node to said second access line via said fourth transistor, and detecting the voltage level on said second access line.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which.

Throughout the figures, like features have been labelled with like reference numerals.

DETAILED DESCRIPTION OF EMBODIMENTS OF THE PRESENT INVENTION

Only those features useful for an understanding of the invention have been illustrated in the figures and will be described in detail in the following. Other aspects, such as the particular applications of the memory cell, have not been described in detail, the memory cell being suitable for use in a wide range of applications.

Figure 2:
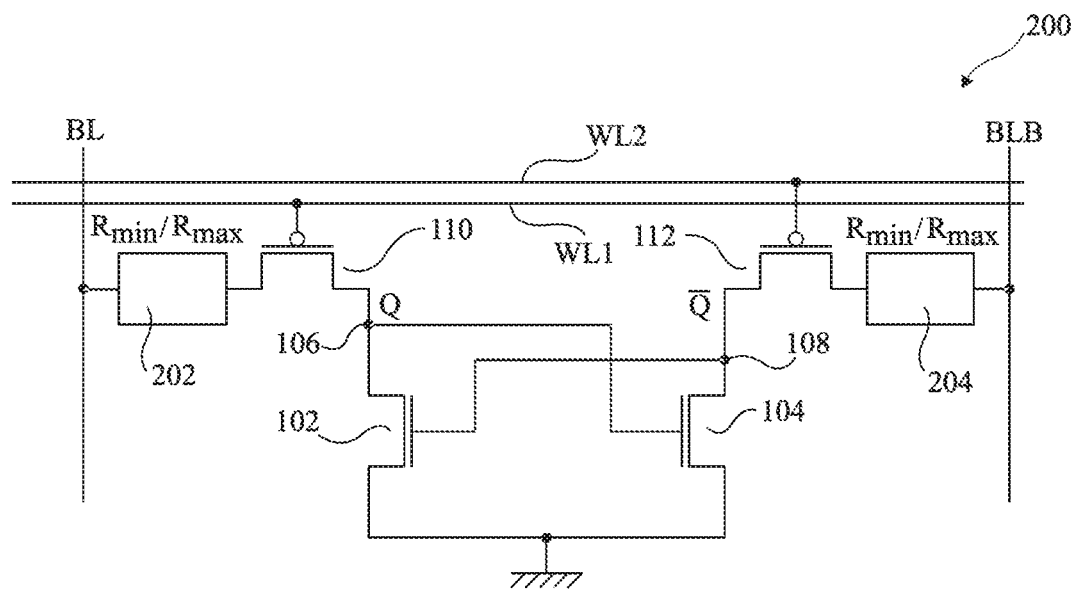
FIG. 2 illustrates a memory cell with non-volatile data storage according to an embodiment of the present invention.

FIG. 2 illustrates a memory cell 200 that stores, in addition to one bit of volatile data, two bits of non-volatile data. The volatile data is stored in electronic form by a latch. The non-volatile data however is stored by the physical state of resistance switching elements 202 and 204, as will now be described.

Figure 1:
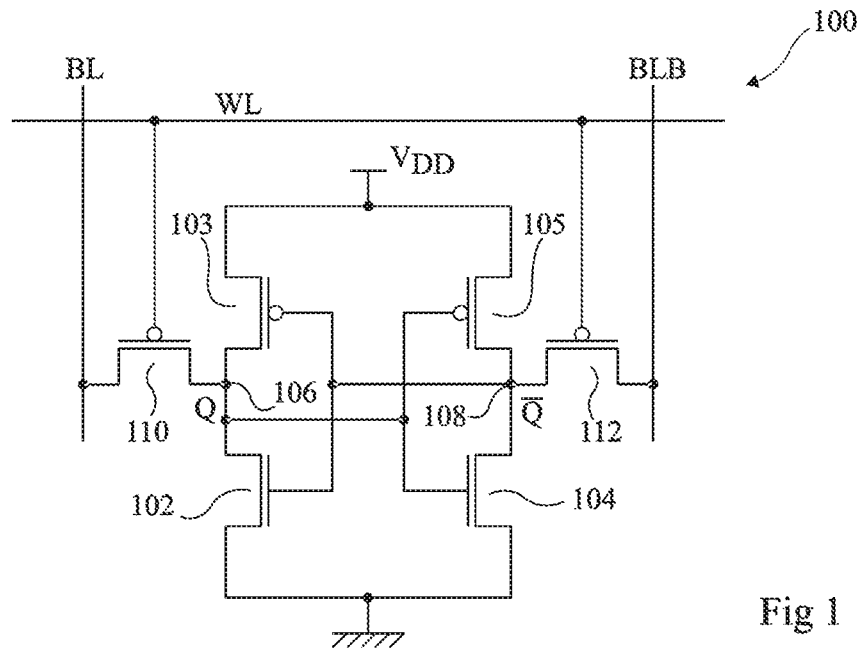
FIG. 1 (described above) illustrates a volatile SRAM cell.

The memory cell 200 is similar to the SRAM cell 100 of FIG. 1 described above, and the common portions will not be described again in detail. However, rather than comprising six transistors, the memory cell 200 comprises just four transistors. Indeed, the PMOS transistors 103 and 105 forming half of each inverter are removed, and thus there is no connection to the supply voltage $V_{DD}$ in memory cell 200. Furthermore, the memory cell 200 additionally comprises the resistance switching elements 202 and 204, of which element 202 is coupled between the drain of transistor 110 and bit line BL, and element 204 is coupled between the drain of transistor 112 and the bit line BLB.

The resistance switching elements 202 and 204 are any resistive elements switchable between two resistance values. Such elements maintain the programmed resistive state even after a supply voltage is removed. The resistance switching elements 202, 204 may be independently programmed, the programmed state of each element indicating one binary data value.

For example, the resistance switching elements 202, 204 are based on magnetic tunnelling junctions (MTJs), such as field-induced magnetic switching (FIMS) elements, thermally assisted switching (TAS) elements, STT (spin-torque-transfer) elements, or those of Toggle MRAM. FIMS-MRAM (magnetic random access memory) are for example discussed in more detail in the publication titled "Magnetoresistive random access memory using magnetic tunnel junctions", S. Tehrani, Proceedings of IEEE, 91(5):3707-714, May 2003. TAS-MRAM are for example discussed in more detail in the publication titled "Thermally Assisted MRAM", Prejbeanu et al.

Alternatively, the resistance switching elements 202, 204 could be other types of resistance switching memory devices, including those used in programmable metallization cells (PMC), such as oxide resistive RAM (OxRRAM), conductive bridging RAM (CBRAM), or phase change RAM (PCRAM), or any other technology allowing similar operation.

Whatever the type of resistance switching element, information is stored by setting each of the elements at either a relatively high resistance ($R_{max}$) or at a relatively low resistance ($R_{min}$). Each of the resistance switching elements 202, 204 for example has just two resistive states corresponding to the high and low resistances $R_{max}$ and $R_{min}$, although the exact values of $R_{min}$ and $R_{max}$ may vary depending on conditions such as temperature, process variations etc. The resistances are for example selected such that $R_{max}$ is always significantly greater than $R_{min}$, for example at least 20 percent greater. In general, the ratio between the resistance $R_{max}$ and the resistance $R_{min}$ is for example between 1.7 and 5 for an MRAM, or more generally between 1.2 and 10000, depending on the technology. In one example, $R_{min}$ is in the region of 2.5 k ohms, and $R_{max}$ is in the region of 5 k ohms, although many other values are possible.

In the SRAM cell 100 of FIG. 1, transistors 103 and 105 are coupled to the supply rail $V_{DD}$ and perform the role of maintaining the high state of Q or $\overline{Q}$ at node 106 or 108 when the cell is in standby between write and read operations. In the cell 200 of FIG. 2, in which these transistors have been removed, the high state of Q or $\overline{Q}$ is maintained by leakage current passing through the PMOS transistor 110 or 112, from the corresponding bit line BL or BLB. For example, the bit lines BL and BLB are charged to the supply voltage $V_{DD}$ at least periodically during the standby state, to generate the leakage current.

The threshold voltages of the PMOS transistors 110, 112 are lower than those of NMOS transistors 102, 104, such that when in the non-conducting state, the current leakage through transistors 110 and 112 is greater than through transistor 102 or 104, thereby keeping the corresponding node 106 or 108 at a voltage high enough to be seen as a high logic level. In other words, the leakage current $I_{offP}$ flowing through PMOS transistor 110 or 112 when a high voltage is applied to its gate node is greater that the leakage current $I_{offN}$ flowing through the corresponding NMOS transistor 102 or 104 when a low voltage is applied to its gate node. The particular threshold voltages will depend on the technology used. But as an example, the threshold voltages of PMOS transistors 110, 112 are chosen to be in the range 0.3 to 0.5 V, while the threshold voltages of NMOS transistors 102, 104 are in the range 0.4 to 0.6 V. In any case, the ratio $I_{offP}/I_{offn}$ is selected for example to be greater than 25, and preferably greater than 100.

In operation, for reading and writing data to the volatile portion of the memory cell 200, in other words to the storage nodes 106 and 108, the process is the same as for the memory cell 100, and is not affected by the programmed resistance values of the resistance switching elements 202 and 204. Briefly, writing a bit of data to nodes 106, 108 involves applying, while transistors 110 and 112 are turned on by a low voltage on word lines WL1 and WL2, a high or low voltage to bit line BL depending on the data to be stored, and the opposite voltage to bit line BLB. Reading the data from nodes 106 and 108 involves pre-charging the bit lines BL and BLB, and then turning on transistors 110 and 112 and determining which bit line voltage drops first, with the aid of a sense amplifier (not illustrated), which amplifies the voltage difference between the bit lines. Preferably, so as not to slow the read and write operations to the volatile storage nodes and to prevent a bit-flip during a read operation, the value of $R_{max}$ is chosen not to be greater than around 5 k ohms, although this value will depend on the particular technology used, and in particular the on resistance of the transistors.

Independently of this normal SRAM operation, the resistance switching elements may each be programmed to store one bit of non-volatile data, and the memory cell may be controlled to transfer the data, from physical storage determined by the resistive state of element 202 or of element 204, to electronic storage determined by the voltage states of the storage nodes 106, 108. Once transferred, this data may be read from the SRAM cell in a standard fashion.

Programming of the resistance switching elements 202 and 204 according to one example will now be described with reference to FIGS. 3, 4A, 4B and 5.

Figure 3:
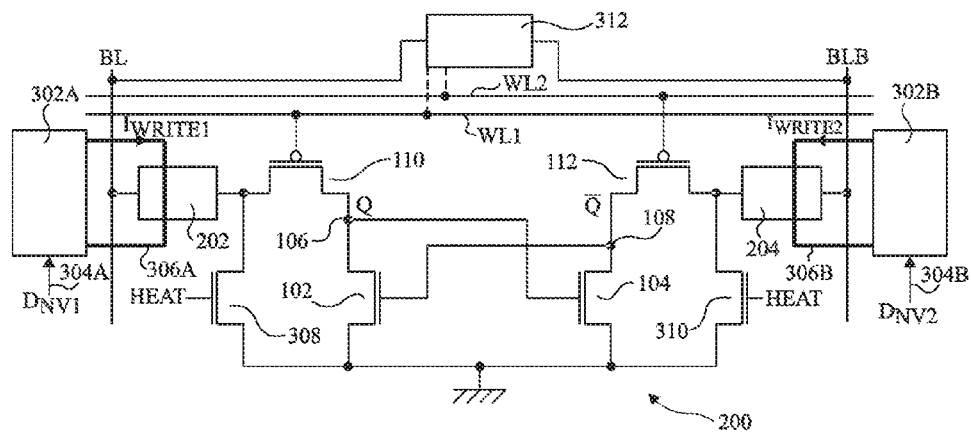
FIG. 3 illustrates programming circuitry for programming the non-volatile portion of the memory cell of FIG. 2.

FIG. 3 illustrates the memory cell 200 along with write control circuits 302A and 302B arranged to program the resistance switching elements 202 and 204 respectively, based on respective bits of non-volatile data $D_{NV1}$ and $D_{NV2}$. In particular, circuit 302A receives the data $D_{NV1}$ on an input line 304A, while circuit 302B receives the data $D_{NV2}$ on an input line 304B. Based on this non-volatile data $D_{NV1}$, $D_{NV2}$, the circuits 302A, 302B generate write currents $I_{WRITE1}$, $I_{WRITE2}$ respectively, provided on respective conductive tracks 306A, 306B that pass by the corresponding resistance switching element 202, 204. The current $I_{WRITE1}$ generate a magnetic field, which passes through the resistance switching element 202 and programs its resistive state. Similarly, the current $I_{WRITE2}$ generate a magnetic field, which passes through the resistance switching element 204 and programs its resistive state.

In the case of thermally assisted switching MRAM, prior to supplying the write current to program each of the resistance switching elements 202, 204, the resistance switching elements are heated by passing a current through them, which aids the transition from one resistive state to another.

As illustrated in FIG. 3, heat control circuitry 312 is for example provided, which applies a voltage to each of the bit lines BL and BLB, this voltage for example being equal to or greater than the supply voltage $V_{DD}$. Alternatively or additionally, NMOS transistors 308 and 310 are coupled between the drains of transistors 110 and 112 respectively and the ground voltage, transistors 308, 310 being activated by a control signal "HEAT" at their gate terminals. Then, by activating the transistors 308, 310 and/or transistors 110, 112, a current will flow from the bit lines BL and BLB through the corresponding resistance switching elements 202, 204 to the ground voltage, which will heat these elements.

An advantage of providing the NMOS transistors 308, 310 is that a relatively high heat current can be generated more easily. Furthermore, when only these transistors are used to heat the elements 202, 204, the state stored by the volatile storage nodes 106, 108 will not be lost during this heating process.

Figures 4A, 4B:
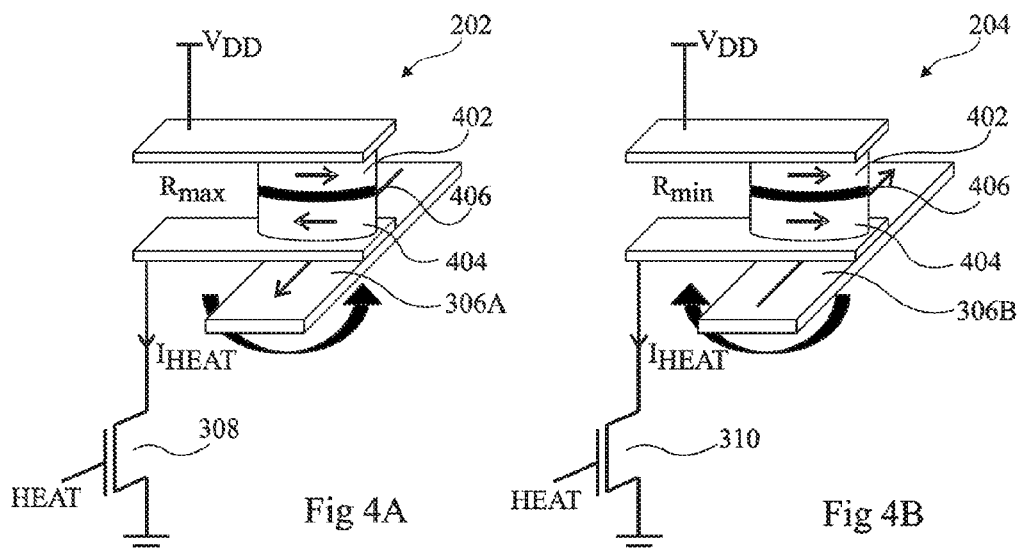
FIGS. 4A and 4B schematically represent examples of the programming of a specific resistance switching memory device.

FIGS. 4A and 4B show the resistance switching elements 202, 204 in more detail in the example that they are TAS elements. Each of the resistance switching elements 202, 204 comprises a pinned ferromagnetic plate 402 and a free ferromagnetic plate 404, plates 402 and 404 sandwiching a tunnel oxide layer 406. The conductive track 306 passes close to the free plate 404 of ferromagnetic material, such that it is affected by the magnetic field generated by the current $I_{WRITE1}$ or $I_{WRITE2}$ flowing through track 306A, 306B respectively. The pinned plate 402 for example has a magnetic orientation in a first direction, while the magnetic orientation of plate 404 may be programmed, by the polarity of the current $I_{WRITE1}$, or $I_{WRITE2}$ to be in the same or opposite direction to that of plate 402. However, programming only occurs in elements that have already been heated, as described in more detail below.

FIG. 4A illustrates element 202 in the case in which the magnetic orientations are in opposite directions in the plates 402, 404, resulting in a maximum resistance $R_{max}$ of the resistance switching element 202, for example in the range 2 k to 5 k Ohms.

FIG. 4B illustrates element 204 in the case in which the magnetic orientations are in a same direction in the plates 402 and 404, resulting in a minimum resistance $R_{min}$ of the resistance switching element 204, for example in the range of 100 to 3 k Ohms.

Figure 5:
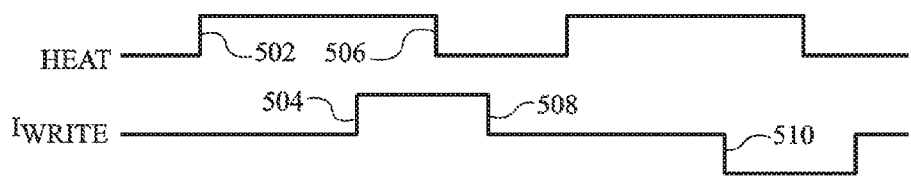
FIG. 5 is a timing diagram illustrating an example of the signals used for programming the non-volatile portion of the memory cell of FIG. 3.

FIG. 5 is a timing diagram illustrating an example of the signal HEAT and the signal $I_{WRITE1}$ during the programming of the resistance switching element 202. Similar signals can be used to program element 204 with the same or opposite state to element 202.

The signal HEAT is asserted by a rising edge 502, thereby activating the transistors 308 and 310. Additionally or alternatively, the transistors 110 and 112 may be activated by a low voltage on lines WL1 and WL2. This generates a current $I_{HEAT}$ through the resistance switching elements 202 and 204, and after a certain period, the signal $I_{WRITE1}$ is asserted, as shown by the rising edge 504 of this signal. In the example of FIG. 5, at rising edge 504 the current becomes positive, which for example programs resistor 202 to be at a high resistance value $R_{max}$.

Next, the signal HEAT is brought low again by a falling edge 506, and/or the signals WL1 and WL2 are broguh high, such that the heating current $I_{HEAT}$ is stopped, and the resistance switching elements 202, 204 cool in their current resistive state. Then the signal $I_{WRITE1}$ is brought low by a falling edge 508, to end the programming process.

The subsequent transitions of the signals in FIG. 5 correspond to the programming of opposite resistive states of the resistive element 202. These transitions are identical to those previously described, except that the signal $I_{WRITE1}$ becomes negative at a falling edge 510, rather than positive, to program the opposite resistive states.

In one example, the time during which the signals HEAT and/or WL are active between edges 502 and 506 is around 20 ns. Thus a write operation can be achieved in little more than 35 ns. However, the heating and cooling-off times will vary based on factors such as the materials used, their volumes, etc., and also the heat currents that are applied, and thus the above values are given only as approximate examples.

The currents $I_{WRITE1}$, $I_{WRITE2}$ are for example in the region of 10 mA for programming one value of the data bit, or in the region of −10 mA for programming the opposite value of the data bit, although other values could be used.

Figure 6A:
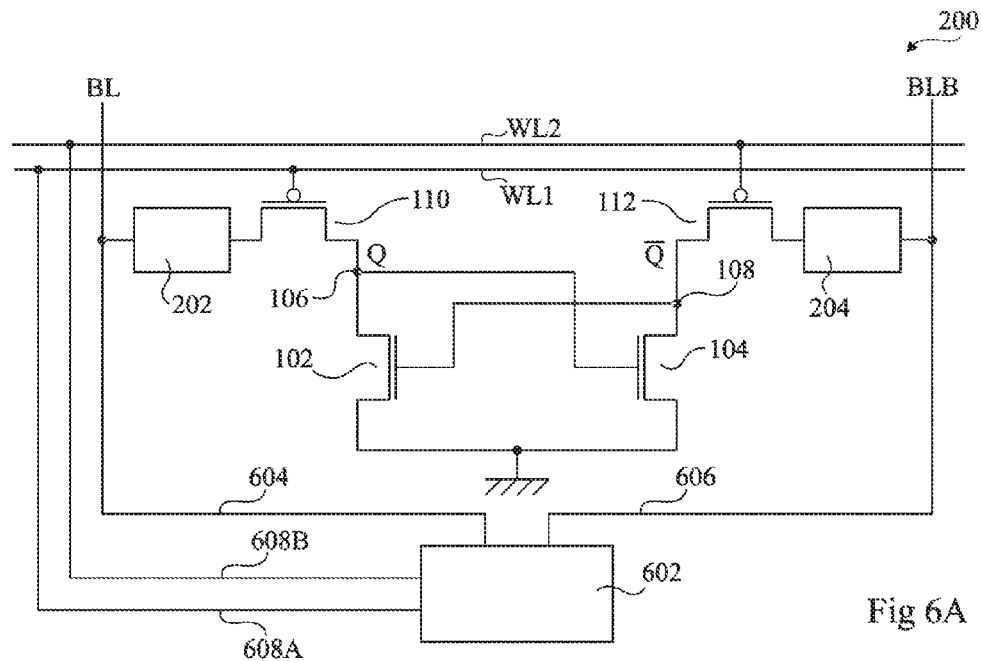
FIG. 6A illustrates an example of control circuitry for copying data stored by non-volatile data storage elements to volatile data storage elements of the memory cell.

FIG. 6A illustrates the memory cell 200 along with transfer control circuitry 602, for controlling the transfer of the data bit stored by the resistance switching element 202 or element 204 in the non-volatile portion of the memory cell to the volatile data storage portion. In particular, the circuitry 602 comprises output lines 604 and 606 coupled to bit lines BL and BLB respectively, and output lines 608A, 608B coupled to the word lines WL1 and WL2 respectively.

An example of transferring the bit of data stored by resistance switching element 202 to the storage nodes 106, 108 will now be described with reference to FIG. 6B.

Figure 6B:
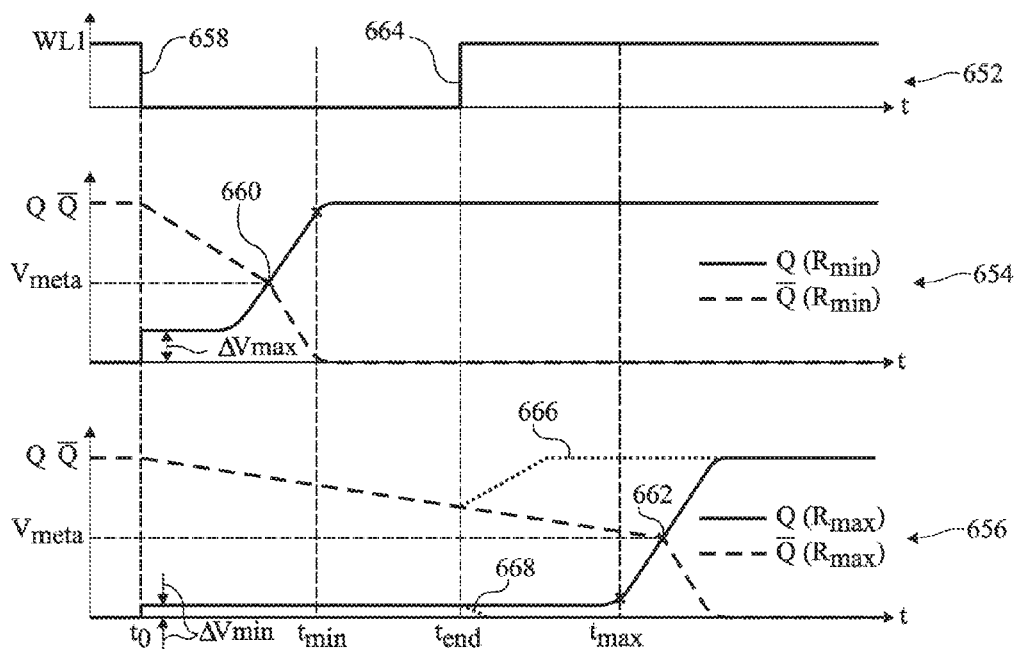
FIG. 6B shows timing diagrams of examples of signals in the circuitry of FIG. 6A.

A timing diagram 652 of FIG. 6B illustrates the word line signal WL1. A timing diagram 654 of FIG. 6B illustrates, by a solid line, the voltage Q, and by a dashed line, the voltage $\overline{Q}$, in the case that element 202 is programmed to be at $R_{min}$. A timing diagram 656 of FIG. 6B similarly illustrates the voltage Q and $\overline{Q}$, but in the case that element 202 is programmed to be at $R_{max}$.

Initially, the storage nodes 106, 108 are in the state in which voltage Q is low, and voltage $\overline{Q}$ is high. For example, a write operation is initially performed (not shown in FIG. 6B) to set these states of the nodes 106, 108. Thus, as illustrated in timing diagrams 654 and 656, voltage Q is initially at a low value, for example the ground voltage, and voltage $\overline{Q}$ is initially at a high value, for example the supply voltage $V_{DD}$. Furthermore, the bit lines BL and BLB are coupled to the supply voltage $V_{DD}$, and remain coupled to $V_{DD}$ during the transfer phase.

At the start of the transfer phase, a falling edge 658 of the word line signal WL1 activates transistor 110. A current thus starts to flow from bit line BL to ground via transistors 110 and 102, the level of this current depending on the programmed resistance of element 202.

As shown in diagram 654, in the case that element 202 is at $R_{min}$, the current through transistors 110, 102 causes an immediate increase in the voltage Q by a value $\Delta V_{max}$, corresponding to the voltage drop across transistor 102. Due to the increased level of voltage Q, current leakage through transistor 104 will increase in proportion to the increased level of the voltage Q, and will be above the level of current leakage of transistor 112, thereby causing the voltage $\overline{Q}$ at node 108 to fall. Once the voltage $\overline{Q}$ has fallen beyond a certain level, transistor 102 will be sufficiently off to cause the voltage Q at node 106 to increase. A point of metastability 660 is passed when Q and $\overline{Q}$ are both at an intermediate voltage $V_{meta}$, after which point Q will continue to rise to close to the supply voltage $V_{DD}$, and $\overline{Q}$ will more rapidly fall to zero, due to the turning on of transistor 104.

As shown in diagram 656, in the case that element 202 is at $R_{max}$, the same sequence of events as in diagram 654 will occur, but due to the lower current flowing through element 202, everything will happen more slowly. Indeed, the current through transistor 110 triggered by the falling edge 658 of signal WL1 will lead to a smaller increase $\Delta V_{min}$ in the voltage Q, and thus the current leakage through transistor 104 will be lower than in the previous example. Thus a point of metastability 662, at which voltages Q and $\overline{Q}$ are equal to the intermediate voltage $V_{meta}$, would be passed later than in the previous example.

However, at a time $t_{end}$ before point 662 is reached, and after point 660 of diagram 604, a rising edge 664 of signal WL1 turns off transistors 110, thereby disconnecting storage node 106 from the bit line BL. The occurrence of edge 664 between these points 660, 662 enables the states $R_{min}$ or $R_{max}$ of element 202 to be distinguished. Indeed, after edge 664, the voltages Q and $\overline{Q}$ at storage nodes 106, 108 will then go to their closest stable state, which in diagram 654 will be the high Q, low $\overline{Q}$ state, which has already been reached, and in diagram 656 will be the low Q, high $\overline{Q}$ state, the transition to which is shown by dotted lines 666 and 668.

The time $t_{end}$ of rising edge 664 is for example chosen to fall after a time $t_{min}$, which corresponds to an increase of the voltage Q around 90 percent towards the high state in the case that element 202 is at $R_{min}$. Rising edge 664 is also for example chosen to fall before a time $t_{max}$, which corresponds to an increase of Q by less than 10 percent towards the high state in the case that element 202 is at $R_{max}$. For example, time $t_{end}$ could be chosen to be halfway between $t_{min}$ and $t_{max}$, or halfway between the metastability points 660, 662.

In order to alternatively transfer the bit of data stored by resistance switching element 204 to the storage nodes 106, 108, the signal WL2 applied to transistor 112 is for example the same as signal WL1 of diagram 652 of FIG. 6B.

The duration that the word line signal WL1 is low in FIG. 6B is for example in the region of 3 ns, and thus such a data transfer from the non-volatile storage to the volatile storage can be performed in approximately only 3 ns, a time comparable to the read and write times of the SRAM portion of the memory cell 200. However, this duration will depend on factors such as the value of $R_{min}$ and the dimensions of the transistors of the memory cell.

Figure 7A:
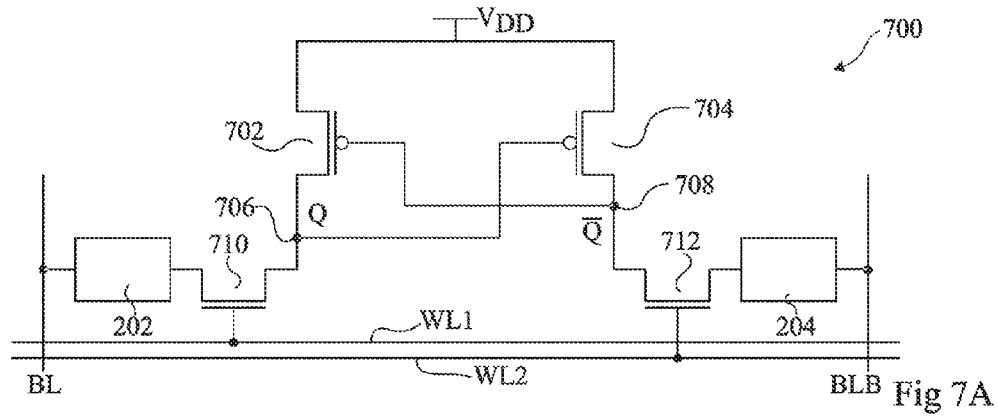
FIG. 7A illustrates a memory cell with non-volatile storage according to a further embodiment of the present invention.

FIG. 7A illustrates a memory cell 700, which is similar to the memory cell 200 of FIG. 2, but in which the NMOS transistors 102, 104 are replaced by PMOS transistors 702 and 704 coupled between respective nodes 706, 708 and a supply voltage $V_{DD}$, and the PMOS transistors 110, 112 are replaced by NMOS transistors 710, 712 coupled between the respective bit lines BL and BLB and the respective nodes 706, 708. The resistance switching elements 202, 204 are coupled between the drains of transistors 710 and 712 respectively, and the bit lines BL and BLB respectively.

In the circuit of FIG. 7A, the threshold voltages of transistors 710 and 712 are lower than those of transistors 702 and 704, such that a leakage current will keep the state of the corresponding node 706 or 708 at a voltage value low enough to be seen as a logic low state during the standby phase between read or write operations. Furthermore, the bit lines BL and BLB are for example at least periodically brought to a low voltage during the standby phase to ensure such a leakage current.

The circuit 700 operates in a similar fashion to circuit 200 during read and write operations, except that transistors 710, 712 are activated by a high voltage level on the word line WL1 or WL2. Furthermore, programming the resistance switching elements 202, 204 may be performed by circuitry similar to that of FIG. 3, except that the heating transistors 308, 310 will be coupled to the supply voltage $V_{DD}$ rather than to ground. Transfer of the data stored by the elements 202, 204 to the storage nodes 106, 108 may also be performed by the circuitry 602 of FIG. 6, as will now be described with reference to the timing diagrams of FIG. 7B.

Figure 7B:
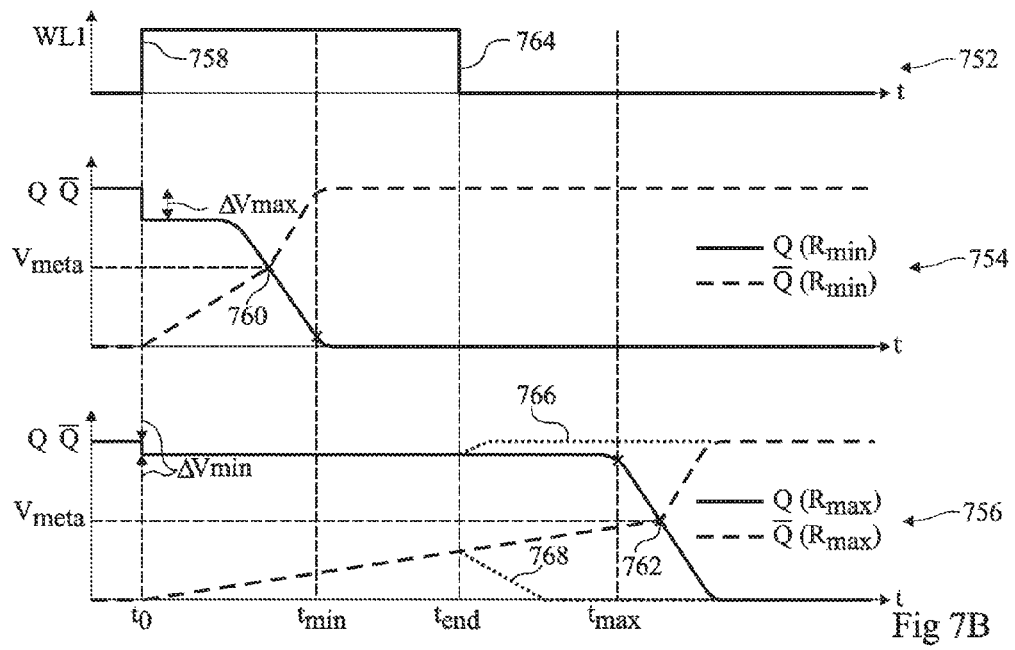
FIG. 7B shows timing diagrams of examples of signals in the circuitry of FIG. 7A.

In FIG. 7B, as with FIG. 6B, timing diagrams 752, 754 and 756 illustrate respectively the word line signal WL1, the voltages Q and $\overline{Q}$ in the case that the element 202 is at $R_{min}$, and the voltages Q and $\overline{Q}$ in the case that the element 202 is at $R_{max}$.

Initially, for the circuit 700, prior to starting the transfer phase, the voltage Q at node 706 is at a high state, for example at the supply voltage $V_{DD}$, while the voltage $\overline{Q}$ is at a low state, for example at the ground voltage. For example, a write operation is initially performed (not shown in FIG. 6B) to set these states of the nodes 106, 108. The bit lines BL and BLB are at a low voltage.

Then, the word line signal WL1 is brought high by a rising edge 758, activating transistor 710 and thus coupling node 706 to bit line BL. As with the circuit of FIG. 6A, this will generate a current through element 202, the level of which depends on the programmed resistive state of element 202. This current has the effect of reducing the voltage Q, initially by a value of $\Delta V_{max}$ for the case of timing diagram 754, or $\Delta V_{min}$ for the case of timing diagram 756. Furthermore, the point of metastability 760 for the case of diagram 754 will occur much sooner than the point 762 for the case of diagram 756. The falling edge 764 of signal WL1 is chosen to be at a time $t_{end}$ between these points, and for example after a time $t_{min}$ when Q has fallen to around 10 percent of its high value in the case that element 202 is at $R_{min}$, and before a time $t_{max}$ when Q has fallen by only around 10 percent in the case that element 202 is at $R_{max}$. The falling edge 764 causes the voltages at storage nodes 706, 708 to go to the closest stable state, which is the low Q, high $\overline{Q}$ state in diagram 754, or the high Q, low $\overline{Q}$ state in FIG. 7B as illustrated by dotted lines 766 and 768.

Figure 8A:
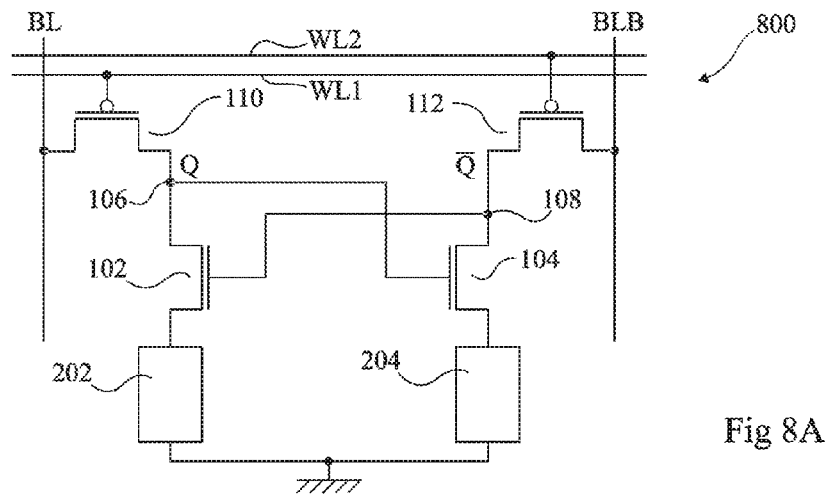
FIG. 8A illustrates a memory cell with non-volatile data storage according to a further embodiment of the present invention.

FIG. 8A illustrates a further embodiment of a memory cell 800, which is similar to cell 200 of FIG. 2, but in which the resistance switching elements 202, 204 are coupled between the transistors 102, 104 respectively and the ground voltage. In such a case, the ratio $R_{max}/R_{min}$ is preferably at least 30, and thus the elements 202, 204 are for example PCM (Phase Change Memory) elements. Furthermore, $R_{min}$ is for example in the region of around 100 ohms, while $R_{max}$ is for example several thousand ohms. Operation of the circuit of FIG. 8A is similar to that of the circuit of FIG. 2.

Figure 8B:
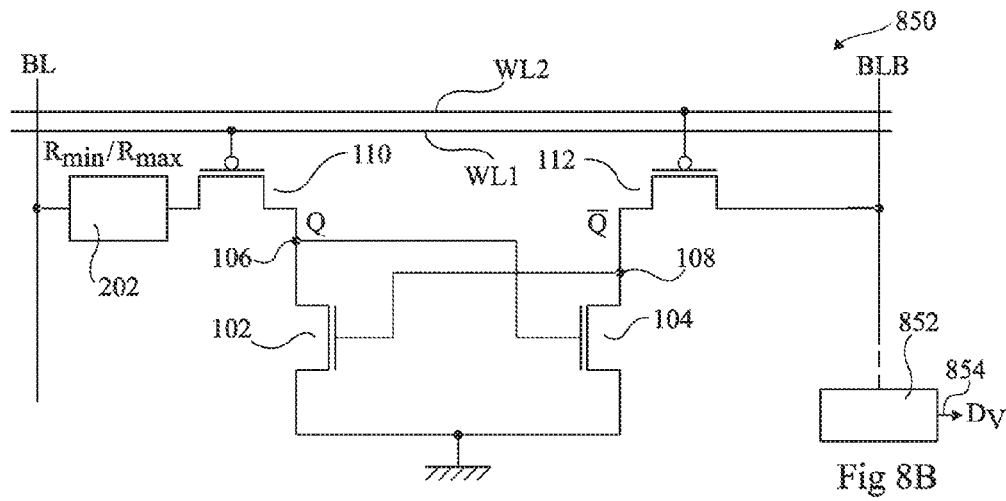
FIG. 8B illustrates a memory cell with non-volatile data storage according to yet a further embodiment of the present invention.

FIG. 8B illustrates yet a further embodiment of a memory cell 850, which is identical to memory cell 200 of FIG. 2, but which comprises just one resistance switching element 202. Thus, in addition to one bit of volatile data stored at nodes 106, 108, the circuit 850 stores one bit of non-volatile data based on the programmed state of element 202. This non-volatile data may be transferred to the volatile storage in the same manner as described above with reference to FIGS. 6A and 6B. However, advantageously the volatile data may be read from only node 108 via PMOS transistor 112. In particular, sensing circuitry 852 is provided coupled to the bit line BLB. When the word line WL2 is selected by a low voltage, circuitry 852 detects bit line voltage after a short time delay, for example in the region of 1 or 2 ns, in order to distinguish between a fast fall ($\overline{Q}$ at zero volts) and a slow fall ($\overline{Q}$ at VDD). For example, a determined time period after transistor 112 is activated, the level on line BLB is sampled, and the level is compared to a threshold in order to detect a high or low bit.

Figure 9:
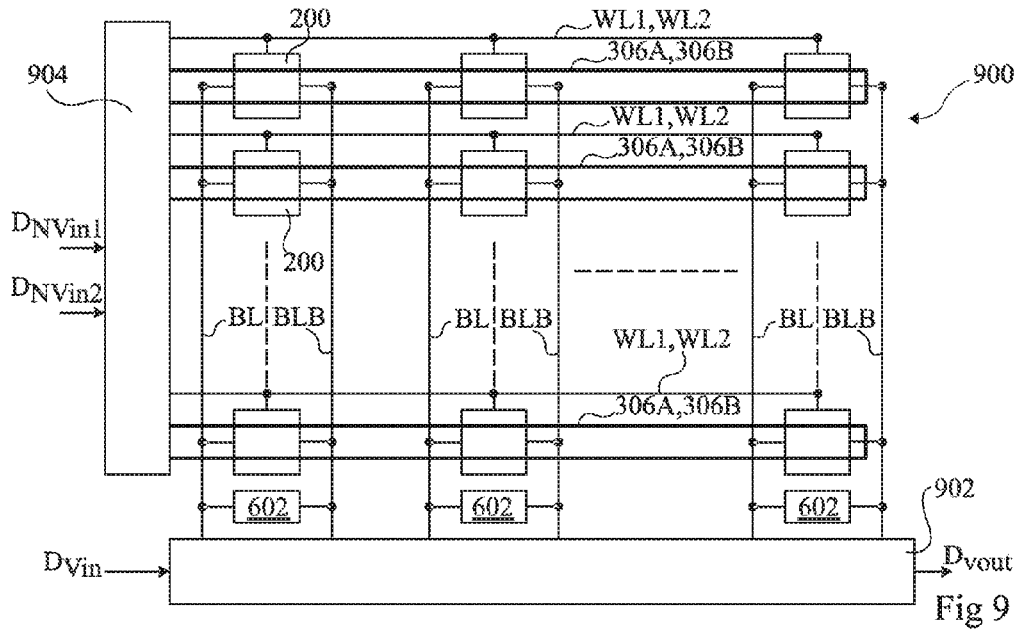
FIG. 9 illustrates a memory array according to an embodiment of the present invention.

FIG. 9 illustrates a memory array 900 of the memory cells 200, although alternatively the memory cells could be cells 700, 800 or 850 described above.

The memory cells 200 are arranged in columns and rows, each being coupled to bit lines BL and BLB common to each of the columns. The bit lines are coupled to control circuitry 902, which for example receives volatile input data $D_{VIN}$, and outputs volatile output data $D_{VOUT}$, which could be the externally inputted volatile data, or volatile data that is generated from a transfer of the non-volatile data stored by the resistance switching elements. The circuitry 902 for example also controls the voltages on the bit lines BL and BLB during the transfer phase, and if appropriate during the writing of non-volatile data.

Each of the cells 200 is also coupled to corresponding word lines WL1, WL2 common to each row of cells. A pair of conductive tracks 306A, 306B form loops passing by each cell and conducting the currents $I_{WRITE1}$ and $I_{WRITE2}$ respectively for writing to the resistance switching elements 202, 204 of each of the memory cells. Each of the lines WL1, WL2 and 306A, 306B is controlled by control circuitry 904, which receives two bits of input non-volatile data $D_{NVin1}$, $D_{NVin2}$ and provides the currents $I_{WRITE1}$ and $I_{WRITE2}$ of the corresponding polarity. Obviously in the case that the array 900 comprises the cells 850 of FIG. 8B, only a single bit of non-volatile data is stored by each cell, and only a single conductive track is used to program the cells of each row.

The writing of the non-volatile data is for example performed row by row, in two phases. During a first phase, only the resistance switching elements of cells for which a first logic value, such as logic "0", is to be programmed are heated. Then, when the corresponding write current is applied to the conductive track 306, the resistive states of only the elements that have been heated will be programmed. During the second phase, the resistance switching elements of the other cells, for which the second logic value, for example a logic "1", is to be programmed are heated. Then, when the corresponding write current is applied to the conductive track 306, again only the resistive states of the elements that have been heated will be programmed.

As indicated by dashed lines in FIG. 9, the memory array 900 may comprise any number of rows of cells and any number of columns of cells, depending on the desired storage capacity.

The example of FIG. 9, in which common tracks 306A, 306B are used for each row of memory cells, has the advantage of being efficient in terms of energy consumption. Indeed, a single current on each track 306A, 306B can be used to program multiple memory cells of the row.

As an alternative, common tracks 306A, 306B could be used for each column, which has the advantage that a row of memory cells can all be programmed in a single programming cycle. Furthermore, given that a current generator provides the current on each track 306A, 306B, the number current generators would then be reduced to twice the number of columns rather than twice the number of rows of the memory.

Figures 10A, 10B:
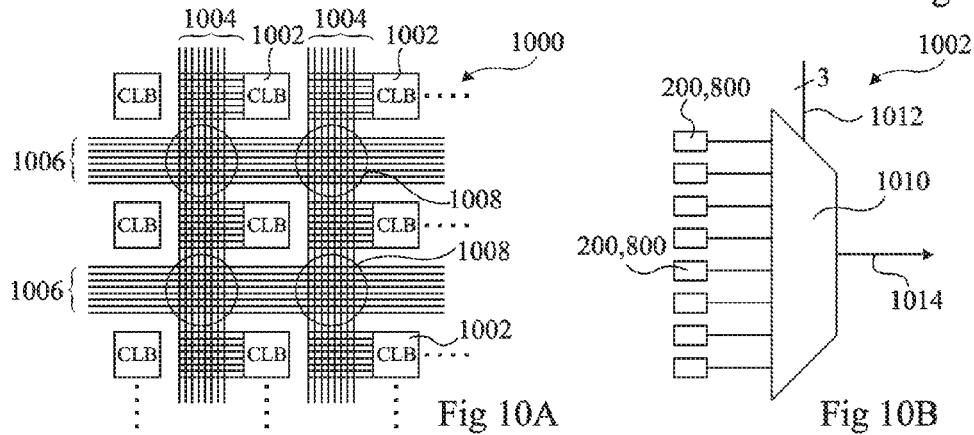
FIG. 10A illustrates a field programmable gate array (FPGA) according to an embodiment of the present invention.
FIG. 10B illustrates a configurable logic block of the FPGA of FIG. 10A in more detail according to an embodiment of the present invention.

FIG. 10A illustrates an FPGA (field programmable gate array) 1000 in which the memory cells 200, 700, 800 or 850 described herein may be implemented. The FPGA comprises an array of configurable logic blocks (CLB) 1002 selectively interconnected by columns of lines 1004, which in turn are selectively interconnected with rows of lines 1006. In particular, switch blocks 1008 are provided at each intersection between column lines 1004 and row lines 1006, allowing the connections between the each of the column lines 1004 with each of the row lines 1006 to be programmed. The switching blocks 1008 for example comprise one or more of the memory cells, allowing the connections between the lines to be programmed in a non-volatile fashion. Furthermore, given that each memory cell may store two bits of non-volatile data, a "multi-context" FPGA may be implemented, switchable between two different operation layouts based on whether the data stored by element 202 or the data stored by element 204 is loaded for programming the connections.

FIG. 10B illustrates one of the CLB 1002 in more detail according to one example in which it comprises a look-up table formed of a multiplexer 1010 having 8 data inputs, each of which is coupled to a memory cell 200, although in alternative embodiments each could be coupled to the memory cell 700, 800 or 850 described above. The memory cell outputs a data value from its volatile storage, i.e. one of the storage nodes 106, 108 or 706, 708. In this application, the memory cell is not coupled to bit lines of a memory array, such bit lines being coupled to multiple memory cells. Instead, they are more generally coupled to access lines, which could be bit lines, or lines coupled to just one memory cell. One of these access lines for example provides the output data value of the cell.

The multiplexer 1010 also comprises a 3-bit control input 1012, controlling which of the 8 input lines is selected, and an output line 1014, outputting the data of the selected input line.

An advantage of the embodiments of the memory cell described herein is that it is capable of storing not only one bit of volatile data, but additionally one or two bits of non-volatile data. Furthermore, the programmed non-volatile data can be quickly loaded to the volatile portion of the memory cell in a simple fashion, by application of a voltage to the access lines of the memory cell. This advantageously means that a state programmed in a non-volatile fashion may be quickly loaded (in around 3 ns), for example upon activation of the memory on power-up or after a sleep period. In the case of an FPGA, this allows a circuit design to be quickly initialised, without the need of loading external data into the device to program memory latches and switches.

A further advantage is that, by controlling each of the transistors 110, 112 independently, an independent bit of non-volatile data may be stored by each resistance switching element, leading to a high storage capacity. Furthermore, the programming of the elements is energy efficient, as one bit is stored by programming just one resistance switching element. Alternatively, in the case in which only one resistive element is present, a fast access path to the cell may be provided via the side of the memory with no resistive element.

According to embodiments described herein, the inverters forming the memory cell are each advantageously implemented by a single transistor, each coupled to the same supply voltage. Thus the memory cell is connected to only one power rail: ground in FIG. 2; and $V_{DD}$ in FIG. 8. The volatile data stored by the memory is maintained by current leakage passing through the access transistors of the memory cell, and this leads to very little static current consumption during a standby state in which the volatile data is to be maintained. Furthermore, this volatile data can be independent of the programmed state of the resistive switching elements.

Furthermore, in the case that the volatile data in the memory is to be discarded during the standby state and only the non-volatile data is to be maintained, the power to the bit lines can be removed altogether, such that even the leakage current becomes negligible. The power consumption of the memory is thus extremely low during such a standby state.

A further advantage of the use of a single transistor for forming each inverter is that the difference between the resistances $R_{min}$ and $R_{max}$ can be relatively low and/or the speed of the transfer of the programmed non-volatile data to the volatile portion of the memory cell can be relatively fast.

Furthermore, advantageously the cell is capable of fast (in around 1 ns) write and read operations for the volatile storage portions, which may occur in a normal fashion irrespective of the programmed states of the non-volatile resistive elements. Furthermore, the write time for the non-volatile portion is also relatively fast (in around 35 ns in the case of an MRAM).

A further advantage of the memory cells described herein is that the circuit is compact, comprising only four transistors and one or two programmable elements for the storage of one or two bits of non-volatile data and one bit of volatile data. Furthermore, the non-volatile data may be read without the need of additional transistors in each memory cell.

Furthermore, the resistance switching elements 202, 204 of FIGS. 2, 7A, 8A and 8B are for example formed in a metal layer above a silicon layer in which the transistors 102 and 104, or 702 and 704 are formed. The positioning of these resistance switching elements 202, 204 connected directly to the ground voltage or directly to the supply voltage $V_{DD}$ is thus advantageous, as a single via may be used from the silicon layer to one terminal of each resistance switching element, and the other terminal of each element can be connected directly to the corresponding supply rail rather than returning on another via to the silicon layer.

A further advantage of the memory cells described herein is that they are CMOS compatible, and the resistance switching elements can be relatively robust in the presence of electromagnetic radiation such as SEUs (single event upsets) and SETs (single event transients).

Having thus described at least one illustrative embodiment of the invention, various alterations, modifications and improvements will readily occur to those skilled in the art.

For example, it will be apparent to those skilled in the art that, while the invention has been described in relation to a memory array and FPGA, the memory cell described herein could be used in other types of memory devices, such as registers or flip-flops.

It will be apparent to those skilled in the art that the ground voltage described herein may be at 0 V, or more generally at any supply voltage $V_{SS}$, that could be different from 0 V.

Furthermore, it will be apparent to those skilled in the art that the variations in the threshold voltages between the transistors 102, 104 and the transistors 110, 112 of the four-transistor memory cell 200 of FIG. 2, or the corresponding transistors of the memory cells 700, 800, 850 of FIGS. 7A, 8A, 8B could be achieved in part by the selection of particular bulk voltages applied to each transistor.

Furthermore, while the various embodiments have been described in relation to MOS transistors, it will be apparent to those skilled in the art that the invention could be equally applied to other transistor technologies, such as bipolar transistors.

Furthermore, the features described in relation to the various embodiments could be combined in alternative embodiments in any combination.

The invention claimed is:

1. A memory device comprising at least one memory cell comprising:
   a first transistor coupled between a first storage node and a first supply line;
   a second transistor coupled between a second storage node and said first supply line, a control terminal of said first transistor being coupled to said second storage node, and a control terminal of said second transistor being coupled to said first storage node;
   a third transistor coupled between said first storage node and a first access line and controllable via a first control line;
   a fourth transistor coupled between said second storage node and a second access line and controllable via a second control line; and a first resistance switching element programmable to have one of first and second resistive states, wherein said first resistance switching element and said first and third transistors are coupled in series; and a second resistance switching element programmable to have one of first and second resistive states, wherein said second resistance switching element and said second and fourth transistors are coupled in series.

2. The memory device of claim 1, further comprising control circuitry adapted to store a data value at said first and second storage nodes by controlling said third transistor to consecutively:

charge said first storage node to said first supply voltage;

couple said first storage node to said second supply voltage; and after a first time period, disconnect said first storage node from said second supply voltage, the data value stored at said first and second storage nodes being determined by the resistive state of said first resistance switching element.

3. The memory device of claim 1, further comprising programming circuitry adapted to independently program the resistances of each of said first and second resistance switching elements based first and second input data values.

4. The memory device of claim 1, wherein said third and fourth transistors are adapted to have a lower threshold voltage than said first and second transistors.

5. The memory device of claim 1, wherein said first resistance switching element is coupled between said first storage node and said first access line.

6. The memory device of claim 1, wherein said first resistance switching element is coupled between said first transistor and said first supply voltage.

7. The memory device of claim 1, wherein said first resistance switching element is one of a:

oxide resistive element;
conductive bridging element;
phase change element;
programmable metallization element;
spin-torque-transfer element;
field-induced magnetic switching element; and
thermally assisted switching element.

8. The memory device of claim 1, wherein said first transistor is the only transistor of a first inverter of said at least one memory cell, and said second transistor is the only transistor of a second inverter of said at least one memory cell.

9. A random access memory comprising an array of the memory devices of claim 1.

10. A data latch comprising the memory device of claim 1.

11. A method of transferring a data value from non-volatile storage of a memory cell to first and second volatile storage nodes of said memory cell, wherein the memory cell comprises: a first transistor (102) coupled between a first storage node and a first supply line; a second transistor coupled between a second storage node and said first supply line, a control terminal of said first transistor being coupled to said second storage node, and a control terminal of said second transistor being coupled to said first storage node; a third transistor coupled between said first storage node and a first access line and controllable via a first control line; a fourth transistor coupled between said second storage node and a second access line and controllable via a second control line; and a first resistance switching element coupled in series with said first and third transistors and programmable to have one of first and second resistive states, wherein said first resistance switching element is the only resistance switching element of said memory cell, the method comprising the consecutive steps of:

charging said first storage node to said first supply voltage;

controlling said third transistor to couple said first storage node to said second supply voltage; and after a first time period, controlling said third transistor to disconnect said first storage node from said second supply voltage, the data value stored at the first and second volatile storage nodes being determined by the resistive state of said first resistance switching element.

12. The method of claim 11, further comprising reading the data stored at said second storage node by coupling said second storage node to said second access line via said fourth transistor, and detecting the voltage level on said second access line.

13. A memory device comprising at least one memory cell comprising:

a first transistor coupled between a first storage node and a first supply line;

a second transistor coupled between a second storage node and said first supply line, a control terminal of said first transistor being coupled to said second storage node, and a control terminal of said second transistor being coupled to said first storage node;

a third transistor coupled between said first storage node and a first access line and controllable via a first control line;

a fourth transistor coupled between said second storage node and a second access line and controllable via a second control line; and a first resistance switching element coupled in series with said first transistor and programmable to have one of first and second resistive states, wherein said first resistance switching element is the only resistance switching element of each of said at least one memory cells.

14. The memory device of claim 13, wherein said control circuitry is further adapted to read said data stored at said second storage node via said fourth transistor.

15. A method of transferring a data value from non-volatile storage of a memory cell to first and second volatile storage nodes of said memory cell, wherein the memory cell comprises: a first transistor coupled between a first storage node and a first supply line; a second transistor coupled between a second storage node and said first supply line, a control terminal of said first transistor being coupled to said second storage node, and a control terminal of said second transistor being coupled to said first storage node; a third transistor coupled between said first storage node and a first access line and controllable via a first control line; a fourth transistor coupled between said second storage node and a second access line and controllable via a second control line; a first resistance switching element programmable to have one of first and second resistive states, wherein said first resistance switching element and said first and third transistors are coupled in series; and a second resistance switching element programmable to have one of first and second resistive states, wherein said second resistance and said second and fourth transistors are coupled in series the method comprising the consecutive steps of:

charging said first storage node to said first supply voltage;

controlling said third transistor to couple said first storage node to said second supply voltage; and after a first time period, controlling said third transistor to disconnect said first storage node from said second supply voltage, the data value stored at the first and second volatile storage nodes being determined by the resistive state of said first resistance switching element.

* * * * *